(12) United States Patent
Lee et al.

(10) Patent No.: US 11,044,802 B2
(45) Date of Patent: Jun. 22, 2021

(54) CIRCUIT BOARD

(71) Applicants: AZOTEK CO., LTD., Taoyuan (TW); Career Technology (MFG.) Co., Ltd, New Taipei (TW)

(72) Inventors: Hung-Jung Lee, Taoyuan (TW); Mou-Lin Li, New Taipei (TW)

(73) Assignees: AZOTEK CO., LTD., Taoyuan (TW); Career Technology (MFG.) Co., Ltd, New Taipei (TW)

( * ) Notice: Subject to any disclaimer, the term of this patent is extended or adjusted under 35 U.S.C. 154(b) by 0 days.

(21) Appl. No.: 15/721,968

(22) Filed: Oct. 2, 2017

(65) Prior Publication Data

US 2018/0235083 A1 Aug. 16, 2018

Related U.S. Application Data

(60) Provisional application No. 62/485,403, filed on Apr. 14, 2017.

(30) Foreign Application Priority Data

Feb. 16, 2017 (TW) .................................. 106202228
Feb. 17, 2017 (TW) .................................. 106202277
Jul. 17, 2017 (TW) .................................. 106123857

(51) Int. Cl.
   *H05K 1/03* (2006.01)
   *H05K 1/02* (2006.01)
   *H05K 3/46* (2006.01)

(52) U.S. Cl.
   CPC .......... *H05K 1/024* (2013.01); *H05K 3/4688* (2013.01); *H05K 2201/0141* (2013.01)

(58) Field of Classification Search
   CPC ...... H05K 1/0298; H05K 1/03; H05K 1/0313; H05K 1/115; H05K 1/024; H05K 1/036; H05K 1/053; H05K 2201/0141
   See application file for complete search history.

(56) References Cited

U.S. PATENT DOCUMENTS 5,625,474 A   4/1997   Aomori et al.
5,719,354 A   2/1998   Jester et al.
(Continued)

FOREIGN PATENT DOCUMENTS

CN   101470278 A   7/2009
CN   102206352 A   10/2011
(Continued)

OTHER PUBLICATIONS

Dutta et al., "Blends containing liquid crystalline polymers: Preparation and properties of melt-drawn fibers, unidirectional prepregs, and composite laminates,"Polymer Composites, vol. 13 (1992), pp. 394-401.

(Continued)

*Primary Examiner* — Hoa C Nguyen
(74) *Attorney, Agent, or Firm* — CKC & Partners Co., LLC (57) ABSTRACT

A circuit board includes a first insulating structure, a first redistribution layer, a second insulating structure, and a second redistribution layer. The first insulating structure has an upper surface and includes a first liquid crystal polymer layer. The first redistribution layer is disposed on the upper surface of the first insulating structure. The second insulating structure is disposed on the upper surface of the first insulating structure and covers the first redistribution layer. The second insulating structure has a top surface opposite to the upper surface and includes a second liquid crystal polymer layer. The second redistribution layer is disposed on the top surface of the second insulating structure.

13 Claims, 4 Drawing Sheets

(56) References Cited

U.S. PATENT DOCUMENTS

| | | | |
|---|---|---|---|
| 5,959,708 A | 9/1999 | Lee et al. | |
| 6,495,244 B1 | 12/2002 | Andresakis et al. | |
| 6,994,896 B2 | 2/2006 | Sethumadhavan et al. | |
| 7,387,858 B2 | 6/2008 | Chari et al. | |
| 8,465,670 B2 | 6/2013 | Kondo et al. | |
| 8,711,300 B2 | 4/2014 | Yamamoto et al. | |
| 2002/0081443 A1 | 6/2002 | Connelly et al. | |
| 2003/0178227 A1* | 9/2003 | Matsunaga | H05K 3/027 174/257 |
| 2009/0111949 A1 | 4/2009 | Cho et al. | |
| 2009/0151984 A1* | 6/2009 | Fujimura | C08J 5/24 174/250 |
| 2009/0151987 A1 | 6/2009 | Yang et al. | |
| 2010/0326696 A1 | 12/2010 | Mahapatra | |
| 2011/0256363 A1* | 10/2011 | Satou | H05K 3/387 428/209 |
| 2011/0315438 A1* | 12/2011 | Ito | H05K 3/285 174/260 |
| 2012/0292085 A1* | 11/2012 | Watanabe | H05K 1/024 174/254 |
| 2013/0146344 A1* | 6/2013 | Lee | C08L 67/00 174/258 |
| 2014/0087165 A1 | 3/2014 | Nair et al. | |
| 2014/0231123 A1 | 8/2014 | Onodera et al. | |
| 2016/0037632 A1* | 2/2016 | Murakawa | H05K 1/0298 174/257 |

FOREIGN PATENT DOCUMENTS

| | | |
|---|---|---|
| CN | 102342186 A | 2/2012 |
| CN | 102471562 A | 5/2012 |
| CN | 103917582 A | 7/2014 |
| CN | 104091761 A | 10/2014 |
| CN | 104167418 A | 11/2014 |
| CN | 104902668 A | 9/2015 |
| CN | 104981094 A | 10/2015 |
| CN | 106054470 A | 10/2016 |
| CN | 107343355 A | 11/2017 |
| JP | 05-090740 A | 4/1993 |
| JP | 08-097565 A | 4/1996 |
| JP | H11249150 A | 9/1999 |
| JP | 3208028 B2 | 9/2001 |
| JP | 2001274554 A | 10/2001 |
| JP | 2001284801 A | 10/2001 |
| JP | 2003-11284 A | 1/2003 |
| JP | 2005178056 A | 7/2005 |
| JP | 2006-8976 A | 1/2006 |
| JP | 2006-282678 A | 10/2006 |
| JP | 2007070418 A | 3/2007 |
| JP | 2007081433 A | 3/2007 |
| JP | 2007-161835 A | 6/2007 |
| JP | 2007235167 A | 9/2007 |
| JP | 2007-253366 A | 10/2007 |
| JP | 2008-37982 A | 2/2008 |
| JP | 2009246200 A | 10/2009 |
| JP | 2010-168410 A | 8/2010 |
| JP | 2010-532567 A | 10/2010 |
| JP | 2011032316 A | 2/2011 |
| JP | 2011080170 A | 4/2011 |
| JP | 2011-134884 A | 7/2011 |
| JP | 2011-216841 A | 10/2011 |
| JP | 2012033869 A | 2/2012 |
| JP | 2012046742 A | 3/2012 |
| JP | 2012242442 A | 12/2012 |
| JP | 2012242622 A | 12/2012 |
| JP | WO2011018837 A1 | 1/2013 |
| JP | 2014120580 A | 6/2014 |
| JP | 2014533325 A | 12/2014 |
| JP | 2015183159 A | 10/2015 |
| JP | 2016062954 A | 4/2016 |
| JP | 2017075339 A | 4/2017 |
| KR | 20020095505 A | 12/2002 |
| KR | 10-2011-0073272 A | 6/2011 |
| KR | 1020120001623 A | 1/2012 |
| KR | 10-2013-0047456 A | 5/2013 |
| KR | 10-2016-0002401 A | 1/2016 |
| TW | 538663 | 6/2003 |
| TW | 201328443 A | 7/2013 |
| TW | 201706689 A | 2/2017 |
| WO | 2004070694 A2 | 8/2004 |
| WO | 2013065453 A1 | 5/2013 |
| WO | 2014147903 A1 | 9/2014 |
| WO | 2015050080 A1 | 4/2015 |
| WO | 2018056294 A1 | 3/2018 |
| WO | 2018101214 A1 | 6/2018 |

OTHER PUBLICATIONS

Woznicki, "Films and Adhesives," Flex Circuit News, Aug. 2001.

Okamoto et al., "Newly developed LCP film fabricate by solvent-casting method," Sumitomo Kagaku 2005-I.

Le Hoang Sinh et al, Thermal, Dielectric, and Rheological Properties of Aluminum Nitride/Liquid Crystalline Copoly (ester amide)Composite for the Application of Thermal Interface Materials, published on line in Wiley Online Library in 2012.

Hung-Jung Lee, High-Frequency Composite Substrate and Insulating Structure Thereof, U.S. Appl. No. 62/485,403 filed Apr. 14, 2017.

Chung et al., Liquid Crystalline Polymers, Main-Chain_Encyclo. Poly.Sci., Copyright John Wiley & Sons, Oct. 22, 2001 (https://onlinelibrary.wiley.com/doi/abs/10.1002/0471440264.pst180).

Barium-Titanate-(-BaTio3-)-Properties-and-Applications, written by AZO Materials (Jan. 7, 2004) (https://www.azom.com/article.aspx?ArticleID=2280).

Liquid Crystal Polymer (LCP) Typical Properties Generic LCP_UL Prospector (Year: 2021) (https://plastics.ulprospector.com/generics/17/c/t/liquid-crystal-polymer-lcp-properties-processing).

Yang, Kui-Sheng et al., China Strategic Emerging Industry-New Material-Engineering plastics, Dec. 31, 2017 Version 1, Published by China Railway Publishing House Co., Ltd.

* cited by examiner

CIRCUIT BOARD

RELATED APPLICATIONS

This application claims priority to Taiwan Application Serial Number 106123857, filed Jul. 17, 2017, which is herein incorporated by reference.

BACKGROUND

Field of Invention

The present invention relates to a circuit board. More particularly, the present invention relates to a circuit board including a liquid-crystal polymer (LCP).

Description of Related Art

Nowadays, the clock rate of the central processing unit (CPU) used in mobile devices such as smart phones, tablet computers, and laptops is more than gigahertz (GHz), so that conventional mobile device needs to use high-frequency circuits to match the central processing unit having gigahertz clock rate. In order to meet the needs for high-frequency circuits, conventional mobile devices need to reduce the adverse effects caused by the Resistor-Capacitor delay (RC delay).

SUMMARY

According to one aspect of the present disclosure, a circuit board is provided. The circuit board includes a first insulating structure, a first redistribution layer, a second insulating structure, and a second redistribution layer. The first insulating structure has an upper surface and includes a first liquid crystal polymer layer. The first redistribution layer is disposed on the upper surface of the first insulating structure. The second insulating structure is disposed on the upper surface of the first insulating structure and covers the first redistribution layer. The second insulating structure has a top surface opposite to the upper surface and includes a second liquid crystal polymer layer. The second redistribution layer is disposed on the top surface of the second insulating structure.

In some embodiments of the present disclosure, the first insulating structure further includes a first adhesive layer. The first adhesive layer is disposed between the first liquid crystal polymer layer and the first redistribution layer.

In some embodiments of the present disclosure, the first insulating structure further includes a third liquid crystal polymer layer and a second adhesive layer. The second adhesive layer is disposed between the first liquid crystal polymer layer and the third liquid crystal polymer layer.

In some embodiments of the present disclosure, the second insulating structure further includes a fourth liquid crystal polymer layer and a third adhesive layer. The third adhesive layer is disposed between the second liquid crystal polymer layer and the fourth liquid crystal polymer layer.

In some embodiments of the present disclosure, the second insulating structure further includes a conductive via. The conductive via electrically connects to the first redistribution layer and the second redistribution layer.

According to one aspect of the present disclosure, a circuit board is provided. The circuit board includes a first insulating structure, a first redistribution layer, a second insulating structure, a second redistribution layer, a third redistribution layer, a third insulating structure, and a fourth redistribution layer. The first insulating structure has a first surface and a second surface opposite to the first surface, and the first insulating structure includes a first liquid crystal polymer layer. The first redistribution layer is disposed on the first surface of the first insulating structure. The second insulating structure is disposed on the first surface of the first insulating structure and covers the first redistribution layer. The second insulating structure has a third surface opposite to the first surface and includes a second liquid crystal polymer layer. The second redistribution layer is disposed on the third surface of the second insulating structure. The third redistribution layer is disposed on the second surface of the first insulating structure. The third insulating structure is disposed on the second surface of the first insulating structure and covers the third redistribution layer. The third insulating structure has a fourth surface opposite to the second surface and includes a third liquid crystal polymer layer. The fourth redistribution layer is disposed on the fourth surface of the third insulating structure.

In some embodiments of the present disclosure, the first insulating structure further includes a first adhesive layer and a second adhesive layer. The first adhesive layer is disposed between the first liquid crystal polymer layer and the first redistribution layer, and the second adhesive layer is disposed between the first liquid crystal polymer layer and the third redistribution layer.

In some embodiments of the present disclosure, the first insulating structure further includes a fourth liquid crystal polymer layer and a third adhesive layer. The third adhesive layer is disposed between the first liquid crystal polymer layer and the fourth liquid crystal polymer layer.

In some embodiments of the present disclosure, the second insulating structure further includes a fifth liquid crystal polymer layer and a fourth adhesive. The fourth adhesive is disposed between the second liquid crystal polymer layer and the fifth liquid crystal polymer layer.

In some embodiments of the present disclosure, the third insulating structure further includes a sixth liquid crystal polymer layer and a fifth adhesive. The fifth adhesive is disposed between the third liquid crystal polymer layer and the sixth liquid crystal polymer layer.

In some embodiments of the present disclosure, the first insulating structure further includes a first conductive via. The first conductive via electrically connects to the first redistribution layer and the third redistribution layer.

In some embodiments of the present disclosure, the second insulating structure further includes a second conductive via. The second conductive via electrically connects to the first redistribution layer and the second redistribution layer.

In some embodiments of the present disclosure, the third insulating structure further includes a third conductive via. The third conductive via electrically connects to the third redistribution layer and the fourth redistribution layer.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Figure 1:
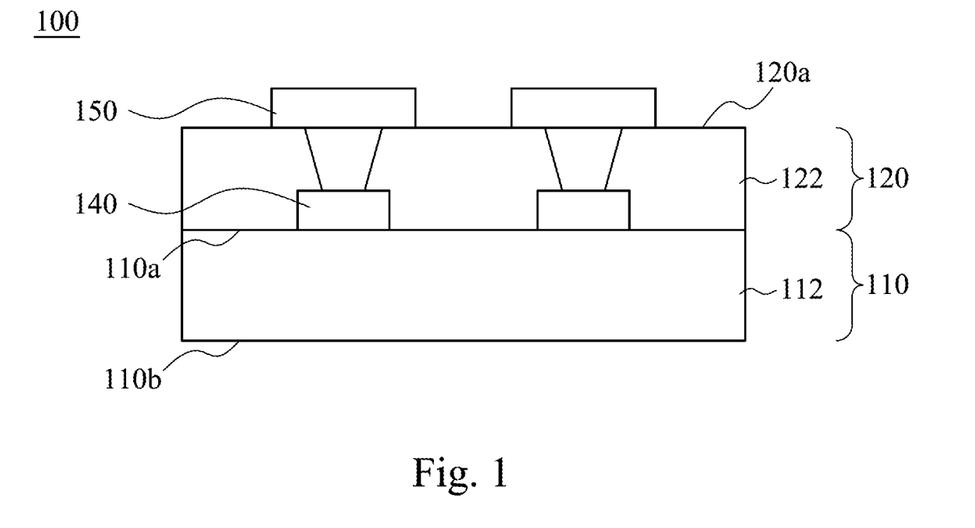
FIG. 1 illustrates a cross-sectional view of the circuit board, in accordance with various embodiments.

Referring to FIG. 1, which schematically illustrates a cross-sectional view of a circuit board 100, in accordance with various embodiments of the present disclosure. As shown in FIG. 1, the circuit board 100 includes a first insulating structure 110, a first redistribution layer 140, a second insulating structure 120, and a second redistribution layer 150. The first insulating structure 110 has a first surface 110a and a second surface 110b. The first insulating structure 110 includes a first liquid crystal polymer layer 112. The first redistribution layer 140 is disposed on the first surface 110a of the first insulating structure 110. The second insulating structure 120 is disposed on the first surface 110a of the first insulating structure 110 and covers the first redistribution layer 140. The second insulating structure 120 has a third surface 120a opposite to the first surface 110a. The second insulating structure 120 includes a second liquid crystal polymer layer 122. The second redistribution layer 150 is disposed on the third surface 120a of the second insulating structure 120.

In some embodiments, the circuit board 100 may be a single-side structure. In some embodiments, the materials of the first liquid crystal polymer layer 112 and the second liquid crystal polymer layer 122 may include a liquid crystal polymer and one or more materials selected from polyester, an aromatic polyamide, a polyphenylene terephthalamide (PPTA), a poly-p-phenylene-2, 6-benzobisoxazole (PBO)), and a poly-p-hydroxybenzoic acid-co-2-hydroxy-6-naphthoic acid, but not limited thereto. In some embodiments, the material of the first liquid crystal polymer layer 112 and the second liquid crystal polymer layer 122 may be the same or different.

More specifically, the liquid crystal polymer may be a soluble liquid crystal polymer formed by modifying the functional groups of a liquid crystal polymer. For example, the functional group of the liquid crystal polymer is modified by the way of addition or substitution. The soluble liquid crystal polymer which has been modified may have the following functional groups, for example, amino groups, carboxamido groups, imido (or imino) groups, amidino groups, aminocarbonylamino groups, aminothiocarbonyl groups, aminocarbonyloxy groups, aminosulfonyl groups, aminosulfonyloxy groups, aminosulfonylamino groups, carboxyl ester groups, (carboxyl ester) amino groups, (alkoxycarbonyl) oxy groups, alkoxycarbonyl groups, hydroxyamino groups, alkoxyamino groups, cyanate groups, isocyanato groups, or a combination thereof, but are not limited thereto. As comparing to the unmodified liquid crystal polymer, the solubilities of the soluble liquid crystal polymer in the certain solvents are greater than that of the unmodified liquid crystal polymer.

In one embodiment, the soluble liquid crystal polymer in the first liquid crystal polymer layer 112 and the second liquid crystal polymer layer 122 is formed by an aromatic liquid crystal polyester solution. The aromatic liquid crystal polyester solution includes a solvent and an aromatic liquid crystal polyester, that is, the aromatic liquid crystal polyester has a good solubility in the solvent, in which the weight percentage of the solid content of the aromatic liquid crystal polyester may be ranged from about 1 wt % to about 85 wt %. The weight percentage of the solid content of the aromatic liquid crystal polyester may be 5 wt %, 15 wt %, 25 wt %, 35 wt %, 45 wt %, 55 wt %, 65 wt %, or 75 wt %, for example. To be specific, the aromatic liquid crystal polyester has been modified with certain functional groups such as for example amino groups, carboxamido groups, imido (or imino) groups, amidino groups, aminocarbonylamino groups, aminothiocarbonyl groups, aminocarbonyloxy groups, aminosulfonyl groups, aminosulfonyloxy groups, aminosulfonylamino groups, carboxyl ester groups, (carboxyl ester) amino groups, (alkoxycarbonyl) oxy groups, alkoxycarbonyl groups, hydroxyamino groups, alkoxyamino groups, cyanate groups, isocyanato groups, or the combination thereof. The solvent in the aromatic liquid crystal polyester solution may be selected, for example, from the group consisting of 1-methyl-2-pyrrolidone, N,N-dimethylacetamide, γ-butyrolactone, dimethylformide, 2-butoxyethanol, and 2-eyhoxyethanol.

In other embodiments, the aromatic liquid crystal polyester solution may further include one or more additives. For example, illustrative examples of the additives include inorganic fillers such as silicon dioxide, aluminium hydroxide, and calcium carbonate; high-dielectric constant fillers such as abarium tatanate and strontium titanate; whiskers such as potassium titanate and aluminium borate; organic fillers such as cured epoxy resins, cross-linked butylated benzoguanamine resins, and cross-linked acrylic polymers; silicone coupling agents; antioxidants; and UV absorbers, but not limited thereto. After removing the solvent of the aromatic liquid crystal polyester solution, the liquid crystal polymer layer is formed.

In other embodiments, the first liquid crystal polymer layer 112 or the second liquid crystal polymer layer 122 may be formed by laminating a film of the liquid crystal polymer. The material, which constitutes the liquid crystal polymeric film, includes a liquid crystal polymer and one or more polymers selected from aromatic polyester, aromatic polyamide, poly-p-phenylene terephthalamide, poly-p-phenylenebenzobisoxazole, and a copolymer of 4-hydroxybenzoic acid and 6-hydroxy-2-naphthoic acid, but not limited thereto. In other embodiments, the liquid crystal polymer layer may be formed by using the soluble liquid crystal polymer solution or the liquid crystal polymeric film.

In some embodiments, the first liquid crystal polymer layer 112 and the second liquid crystal polymer layer 122 are advantageous in good processability, good thermal stability, lower moisture absorption, and low dielectric constant (for example, between about 2 and about 4), and are excellent materials for high frequency substrates.

In some embodiments, the material of the first and/or the second redistribution layers 140,150 may be copper, aluminum, iron, silver, palladium, nickel, chromium, molybdenum, tungsten, zinc, chromium, manganese, cobalt, gold, tin, lead, or stainless steel, or an alloy including at least two of the metallic materials mentioned above, but not limited thereto. In some embodiments, materials of the first redistribution layer 140 and the second redistribution layer 150 may be the same or different. In some embodiments, the contact surface between the first redistribution layer 140 and the first liquid crystal polymer layer 112 may has a roughness ranged from about 0.2 um to about 5 um. For example, the roughness may be 0.5 um, 1 um, 2 um, 3 um, or 4 um to improve a binding force between the first redistribution layer 140 and the first liquid crystal polymer layer 112. Similarly, the contact surface between the second redistribution layer 150 and the second liquid crystal polymer layer 122 may has a roughness of about 0.2 um to about 5 um. For example, the roughness may be 0.5 um, 1 um, 2 um, 3 um, or 4 um.

Figure 2:
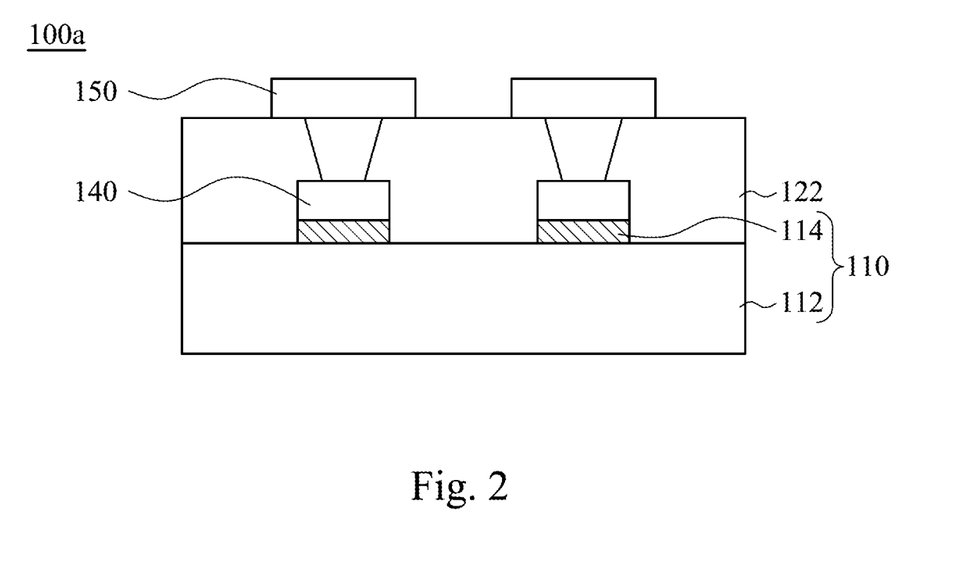
FIG. 2 illustrates a cross-sectional view of the circuit board, in accordance with various embodiments.

Referring to FIG. 2, which illustrates a cross-sectional view of a circuit board 100a, in accordance with some embodiments. As shown in FIG. 2, the first insulating structure 110 of the circuit board 100a may further include a first adhesive layer 114. The first adhesive layer 114 is disposed between the first liquid crystal polymer layer 112 and the first redistribution layer 140. In some embodiments, materials of the first adhesive layer 114 may be an epoxy resin, a phenoxy resin, an acrylic resin, an urethane resin, a silicone rubber, a polycycloexylene resin, a liquid crystal polymer, a bismaleimide resin, or a polyimide resin, or a mixture including at least two polymeric materials mentioned above. In some embodiments, the binding force between the first liquid crystal polymer layer 112 and the first redistribution layer 140 may be enhanced by the first adhesive layer 114. In other embodiments, an adhesive (not shown) may be further included between the second liquid crystal polymer layer 122 and the second redistribution layer 150 to improve the binding force between the second liquid crystal polymer layer 122 and the second redistribution layer 150.

Figure 3:
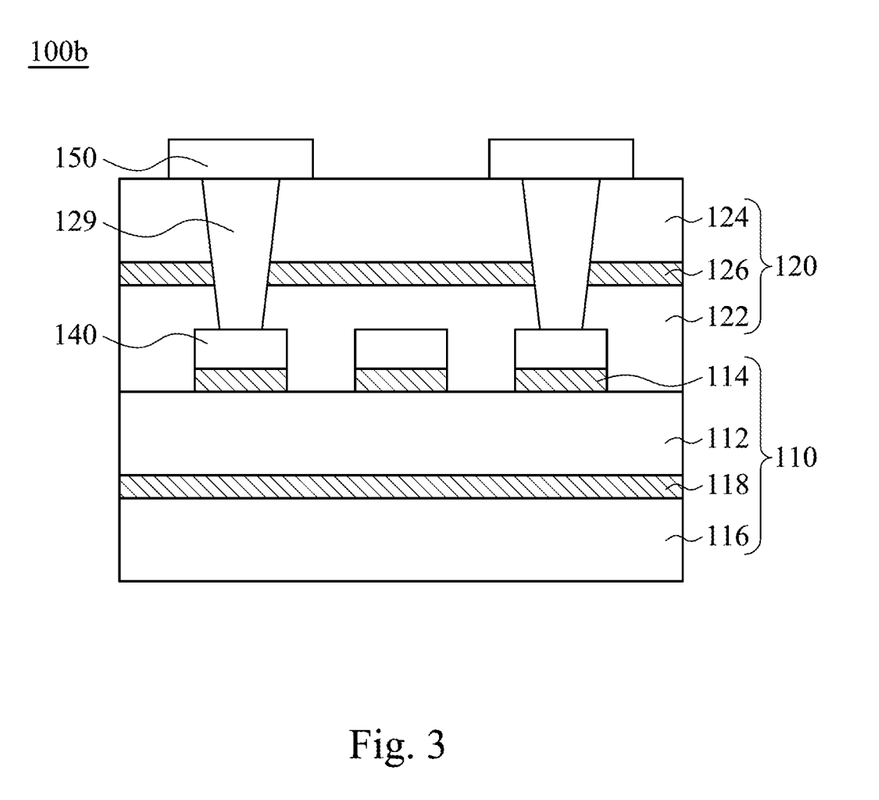
FIG. 3 illustrates a cross-sectional view of the circuit board, in accordance with various embodiments.

Referring to FIG. 3, which illustrates a cross-sectional view of a circuit board 100b, in accordance with some embodiments. As shown in FIG. 3, the first insulating structure 110 of the circuit board 100b may further include a third liquid crystal polymer layer 116 and a second adhesive layer 118. The second adhesive layer 118 is disposed between the first liquid crystal polymer layer 112 and the third liquid crystal polymer layer 116. As shown in FIG. 3, the second insulating structure 120 of the circuit board 100b further includes a fourth liquid crystal polymer layer 124, a third adhesive layer 126, and a conductive via 129. The third adhesive layer 126 is disposed between the second liquid crystal polymer layer 122 and the fourth liquid crystal polymer layer 124. The conductive via 129 penetrates through the fourth liquid crystal polymer layer 124, the third adhesive layer 126, and a portion of the second liquid crystal polymer layer 122, and is electrically interconnected between the first redistribution layer 140 and the second redistribution layer 150. In some embodiments, the materials of the second adhesive layer 118 and the third adhesive layer 126 may be the same as or similar to the material of the first adhesive layer 114. Materials of the third liquid crystal polymer layer 116 and the fourth liquid crystal polymer layer 124 may be the same as or similar to the materials of the first liquid crystal polymer layer 112 and the second liquid crystal polymer layer 122. The conductive materials filled in the conductive via 129 may be the same as or similar to the materials of the first redistribution layer 140 and the second redistribution layer 150. In other embodiments, an adhesive (not shown) may be further included and positioned between the fourth liquid crystal polymer layer 124 and the second redistribution layer 150 to improve the binding force between the fourth liquid crystal polymer layer 124 and the second redistribution layer 150.

Figure 4:
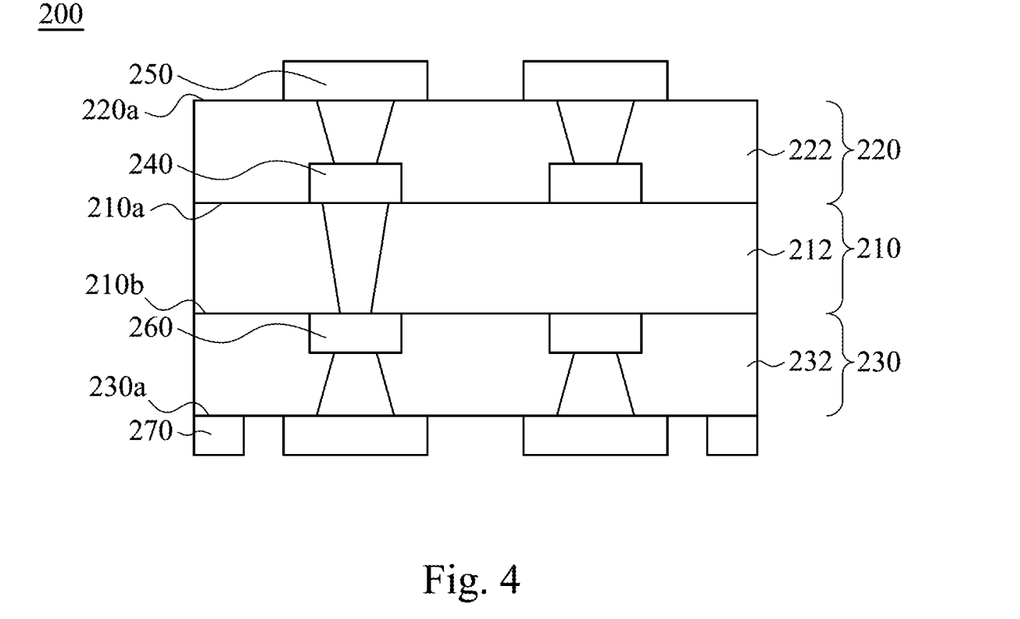
FIG. 4 illustrates a cross-sectional view of the circuit board, in accordance with various embodiments.

Referring to FIG. 4, which illustrates a cross-sectional view of a circuit board 200, in accordance with yet some embodiments. As shown in FIG. 4, the circuit board 200 includes a first insulating structure 210, a first redistribution layer 240, a second insulating structure 220, a second redistribution layer 250, a third redistribution layer 260, a third insulating structure 230, and a fourth redistribution layer 270. The first insulating structure 210 has a first surface 210a and a second surface 210b opposite to the first surface 210a. The first insulating structure 210 includes a first liquid crystal polymer layer 212. The first redistribution layer 240 is disposed on the first surface 210a of the first insulating structure 210. The second insulating structure 220 is disposed on the first surface 210a of the first insulating structure 210 and covers the first redistribution layer 240. The second insulating structure 220 has a third surface 220a opposite to the first surface 210a. The second insulating structure 220 includes a second liquid crystal polymer layer 222. The second redistribution layer 250 is disposed on the third surface 220a of the second insulating structure 220. The third redistribution layer 260 is disposed on the second surface 210b of the first insulating structure 210. The third insulating structure 230 is disposed on the second surface 210b of the first insulating structure 210 and covers the third redistribution layer 260. The third insulating structure 230 has a fourth surface 230a opposite to the second surface 210b. The third insulating structure 230 includes a third liquid crystal polymer layer 232. The fourth redistribution layer 270 is disposed on the fourth surface 230a of the third insulating structure 230.

In some embodiments, the contact surface between the first redistribution layer 240 and the first liquid crystal polymer layer 212 has a roughness of about 0.2 um to about 5 um. For example, the roughness may be 0.5 um, 1 um, 2 um, 3 um, or 4 um to improve the binding force between the first redistribution layer 240 and the first liquid crystal polymer layer 212. Similarly, the roughness of the contact surface between the second redistribution layer 250 and the second liquid crystal polymer layer 222, the roughness of the contact surface between the third redistribution layer 260 and the first liquid crystal polymer layer 212, and the roughness of the contact surface between the fourth redistribution layer 270 and the third liquid crystal polymer layer 232 may be about 0.2 um to about 5 um, for example 0.5 um, 1 um, 2 um, 3 um, and 4 um.

Figure 5:
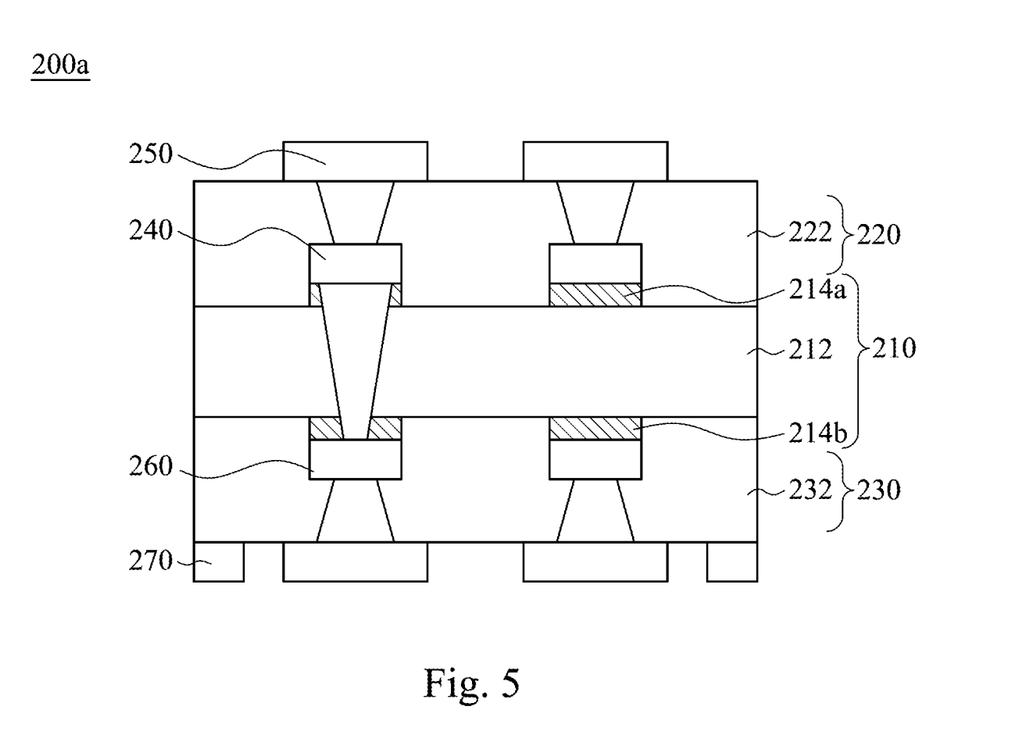
FIG. 5 illustrates a cross-sectional view of the circuit board, in accordance with various embodiments.

Referring to FIG. 5, which illustrates a cross-sectional view of a circuit board 200a, in accordance with some embodiments. As shown in FIG. 5, the first insulating structure 210 of the circuit board 200a may further include a first adhesive layer 214a and a second adhesive layer 214b. The first adhesive layer 214a is disposed between the first liquid crystal polymer layer 212 and the first redistribution layer 240, and the second adhesive layer 214b is disposed between the first liquid crystal polymer layer 212 and the third redistribution layer 260. In some embodiments, the binding force between the first liquid crystal polymer layer 212 and the first redistribution layer 240 may be enhanced by the first adhesive layer 214a. Similarly, the binding force between the first liquid crystal polymer layer 212 and the third redistribution layer 260 may also be enhanced by the second adhesive layer 214b. In other embodiments, the circuit board 200a may further include other adhesive layers (not shown), which are interposed between the second liquid crystal polymer layer 222 and the second redistribution layer 250 as well as between the third liquid crystal polymer layer 232 and the fourth redistribution layer 270. Therefore, the binding force between the fourth liquid crystal polymer layer 124 and the second redistribution layer 150, and the binding force between the third liquid crystal polymer layer 232 and the fourth redistribution layer 270 may be enhanced.

Figure 6:
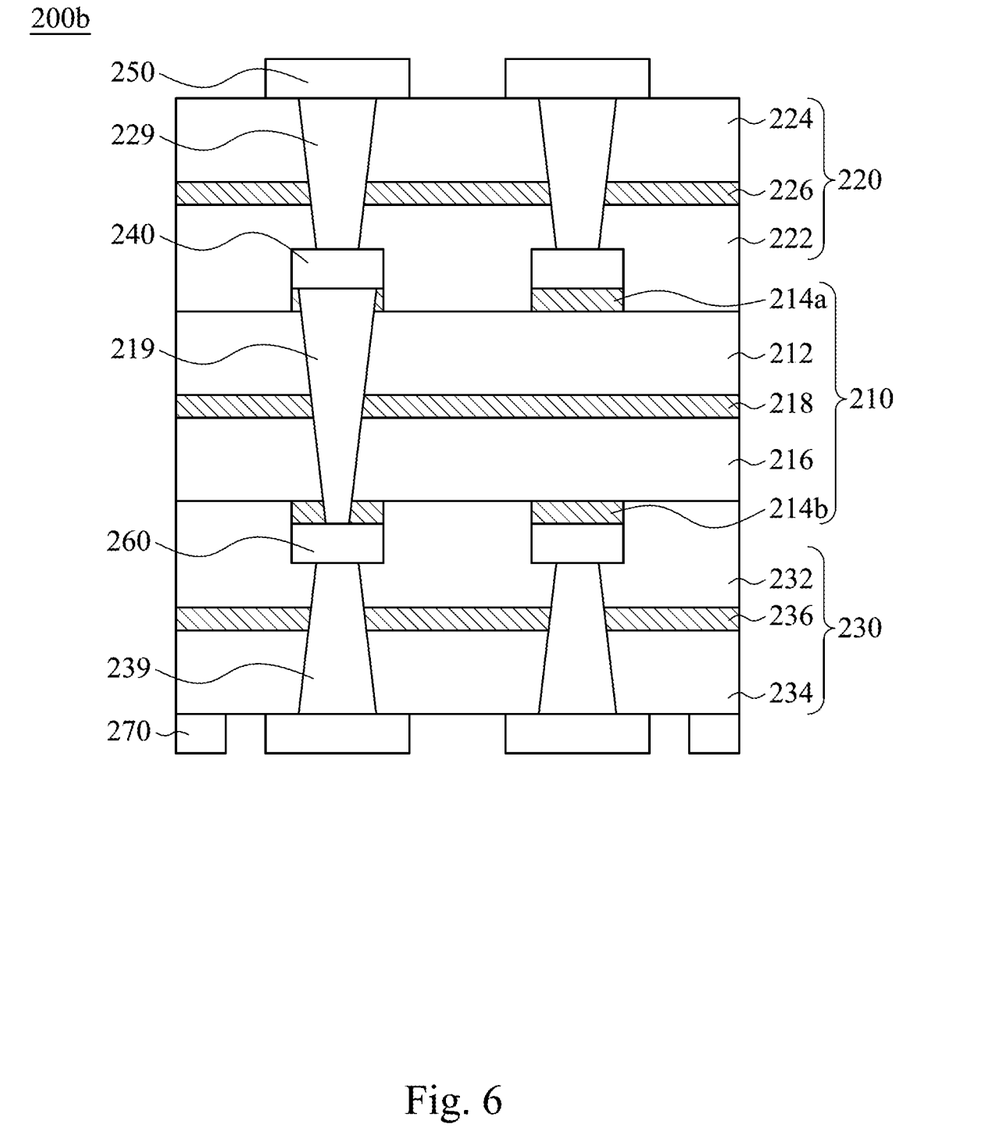
FIG. 6 illustrates a cross-sectional view of the circuit board, in accordance with various embodiments.

Referring to FIG. 6, which illustrates a cross-sectional view of a circuit board 200b, in accordance with various embodiments. As shown in FIG. 6, the first insulating structure 210 of the circuit board 200b may further include a fourth liquid crystal polymer layer 216, a third adhesive layer 218, and a conductive via 219. The third adhesive layer 218 is disposed between the first liquid crystal polymer layer 212 and the fourth liquid crystal polymer layer 216. The conductive via 219 penetrates through the first adhesive layer 214a, the first liquid crystal polymer layer 212, the third adhesive layer 218, the fourth liquid crystal polymer layer 216, and the second adhesive layer 214b. Therefore, the conductive via 219 is electrically connected to the first redistribution layer 240 and the third redistribution layer 260. In some embodiments, the binding force between the first liquid crystal polymer layer 212 and the fourth liquid crystal polymer layer 216 may be enhanced by using the third adhesive layer 218.

As shown in FIG. 6, the second insulating structure 220 of the circuit board 200b may further include a fifth liquid crystal polymer layer 224, a fourth adhesive 226, and a conductive via 229. The fourth adhesive 226 is disposed between the second liquid crystal polymer layer 222 and the fifth liquid crystal polymer layer 224. The conductive via 229 penetrates through the fifth liquid crystal polymer layer 224, the fourth adhesive 226, and a portion of the second liquid crystal polymer layer 222, and is therefore electrically connected to the first redistribution layer 240 and the second redistribution layer 250. In some embodiments, the binding force between the second liquid crystal polymer layer 222 and the fifth liquid crystal polymer layer 224 may be enhanced by using the fourth adhesive 226. In other embodiments, an adhesive (not shown) may also be included and interposed between the fifth liquid crystal polymer layer 224 and the second redistribution layer 250 so to enhance the binding force between the fifth liquid crystal polymer layer 224 and the second redistribution layer 250.

As shown in FIG. 6, the third insulating structure 230 of the circuit board 200b may further include a sixth liquid crystal polymer layer 234, a fifth adhesive 236, and a conductive via 239. The fifth adhesive 236 is disposed between the third liquid crystal polymer layer 232 and the sixth liquid crystal polymer layer 234. The conductive via 239 penetrates through the sixth liquid crystal polymer layer 234, the fifth adhesive 236, and a portion of the third liquid crystal polymer layer 232, and therefore is electrically connected to the third redistribution layer 260 and the fourth redistribution layer 270. In some embodiments, the binding force between the third liquid crystal polymer layer 232 and the sixth liquid crystal polymer layer 234 may be enhanced by using the fifth adhesive 236. In other embodiments, an additional adhesive (not shown) may be interposed between the sixth liquid crystal polymer layer 234 and the fourth redistribution layer 270 to improve the binding force between the sixth liquid crystal polymer layer 234 and the fourth redistribution layer 270.

In some embodiments, the materials of the fourth liquid crystal polymer layer 216, the fifth liquid crystal polymer layer 224, and the sixth liquid crystal polymer layer 234 may be the same as or similar to the materials of the first liquid crystal polymer layer 112 and/or the second liquid crystal polymer layer 122. The materials of the third adhesive layer 218, the fourth adhesive 226, and the fifth adhesive 236 may be the same as or similar to the materials of the first adhesive layer 214a and/or the second adhesive layer 214b. The conductive materials filled the conductive vias 219, 229, and 239 may be the same as or similar to that of the conductive via 129.

In addition, each of the circuit boards disclosed herein may be combined to one another to form a thicker circuit board, without departing from the scope or spirit of this invention. For example, the insulating structure may include two or more liquid crystal polymer layers, but not limited thereto. Depending upon the requirements for different thickness of products, the number of the layers, the materials, and the thickness of each single layer may be adjusted to match the design of the metal wiring loaded on the surface of the insulating structure, such that the circuit board has the optimum ability to withstand high voltage or high current.

Finally, it is important to emphasize that in the situation where the size of the electronic products and the space between the lines are continuously decreased, the embodiments disclosed herein may match the circuit design by adjusting the thickness of the circuit board having the liquid crystal polymer layer. By using the liquid crystal polymer with several excellent characteristics, a high frequency circuit board with a low dielectric constant (between about 2 and about 4) may be fabricated, and the manufacturing processes thereof may be simplified, and further the electronic products using the circuit board disclosed herein may possess excellent performances.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A circuit board, comprising:
    a first insulating structure having an upper surface and comprising a first liquid crystal polymer layer;
    a first redistribution layer disposed on the upper surface of the first insulating structure;
    a second insulating structure disposed on the upper surface of the first insulating structure and covering the first redistribution layer, the second insulating structure having a top surface opposite to the upper surface and comprising a second liquid crystal polymer layer, wherein the first liquid crystal polymer layer and the second liquid crystal polymer layer respectively comprise a soluble liquid crystal polymer, wherein the soluble liquid crystal polymer comprises an aromatic liquid crystal polyester, wherein the aromatic liquid crystal polyester comprises a functional group, and the functional group is selected from the group consisting of a carboxamido group and an (alkoxycarbonyl) oxy group; and a second redistribution layer disposed on the top surface of the second insulating structure;

wherein the first insulating structure further comprises a third liquid crystal polymer layer and a second adhesive layer, and the second adhesive layer is disposed between and in direct contact with the first liquid crystal polymer layer and the third liquid crystal polymer layer;

wherein a contact surface between the first redistribution layer and the first liquid crystal polymer layer has a roughness ranged from about 0.2 μm to about 5 μm.

2. The circuit board of claim 1, wherein the first insulating structure further comprises a first adhesive layer disposed between the first liquid crystal polymer layer and the first redistribution layer.

3. The circuit board of claim 1, wherein the second insulating structure further comprises a fourth liquid crystal polymer layer and a third adhesive layer, and the third adhesive layer is disposed between the second liquid crystal polymer layer and the fourth liquid crystal polymer layer.

4. The circuit board of claim 1, wherein the second insulating structure further comprises a conductive via electrically connected to the first redistribution layer and the second redistribution layer.

5. The circuit board of claim 1, wherein the aromatic liquid crystal polyester is dissolved in a solvent, the solvent is selected from the group consisting of 1-methyl-2-pyrrolidone, N,N-dimethylacetamide, γ-butyrolactone, dimethylformide, 2-butoxyethanol, and 2-eyhoxyethanol.

6. A circuit board, comprising:
a first insulating structure having a first surface and a second surface opposite to the first surface, the first insulating structure comprising a first liquid crystal polymer layer;
a first redistribution layer disposed on the first surface of the first insulating structure;
a second insulating structure disposed on the first surface of the first insulating structure and covering the first redistribution layer, the second insulating structure having a third surface opposite to the first surface and comprising a second liquid crystal polymer layer;
a second redistribution layer disposed on the third surface of the second insulating structure;
a third redistribution layer disposed on the second surface of the first insulating structure;
a third insulating structure disposed on the second surface of the first insulating structure and covering the third redistribution layer, the third insulating structure having a fourth surface opposite to the second surface and comprising a third liquid crystal polymer layer, wherein the first liquid crystal polymer layer, the second liquid crystal polymer layer, and the third liquid crystal polymer layer respectively comprise a soluble liquid crystal polymer, wherein the soluble liquid crystal polymer comprises an aromatic liquid crystal polyester, wherein the aromatic liquid crystal polyester comprises a functional group, and the functional group is selected from the group consisting of a carboxamido group and an (alkoxycarbonyl) oxy group; and
a fourth redistribution layer disposed on the fourth surface of the third insulating structure;
wherein the first insulating structure further comprises a fourth liquid crystal polymer layer and a third adhesive layer, and the third adhesive layer is disposed between and in direct contact with the first liquid crystal polymer layer and the fourth liquid crystal polymer layer;
wherein a contact surface between the first redistribution layer and the first liquid crystal polymer layer has a roughness ranged from about 0.2 μm to about 5 μm.

7. The circuit board of claim 6, wherein the first insulating structure further comprises a first adhesive layer and a second adhesive layer, the first adhesive layer is disposed between the first liquid crystal polymer layer and the first redistribution layer, and the second adhesive layer is disposed between the first liquid crystal polymer layer and the third redistribution layer.

8. The circuit board of claim 6, wherein the second insulating structure further comprises a fifth liquid crystal polymer layer and a fourth adhesive, and the fourth adhesive is disposed between the second liquid crystal polymer layer and the fifth liquid crystal polymer layer.

9. The circuit board of claim 6, wherein the third insulating structure further comprises a sixth liquid crystal polymer layer and a fifth adhesive, and the fifth adhesive is disposed between the third liquid crystal polymer layer and the sixth liquid crystal polymer layer.

10. The circuit board of claim 6, wherein the first insulating structure further comprises a first conductive via electrically connected to the first redistribution layer and the third redistribution layer.

11. The circuit board of claim 6, wherein the second insulating structure further comprises a second conductive via electrically connected to the first redistribution layer and the second redistribution layer.

12. The circuit board of claim 6, wherein the third insulating structure further comprises a third conductive via electrically connected to the third redistribution layer and the fourth redistribution layer.

13. The circuit board of claim 6, wherein the aromatic liquid crystal polyester is dissolved in a solvent, the solvent is selected from the group consisting of 1-methyl-2-pyrrolidone, N,N-dimethylacetamide, γ-butyrolactone, dimethylformide, 2-butoxyethanol, and 2-eyhoxyethanol.

* * * * *